United States Patent [19]

Fujiwara et al.

[11] Patent Number: 5,339,248
[45] Date of Patent: Aug. 16, 1994

[54] APPARATUS FOR MOUNTING ELECTRONIC COMPONENT ON SUBSTRATE

[75] Inventors: Muneyoshi Fujiwara, Katano; Wataru Hirai, Hirakata; Takahiro Yonezawa, Neyagawa; Kunio Sakurai, Sakai, all of Japan

[73] Assignee: Matsushita Electric Industrial Co., Ltd., Kadoma, Japan

[21] Appl. No.: 935,990

[22] Filed: Aug. 27, 1992

[51] Int. Cl.⁵ .................. G06F 15/46; B23P 19/04
[52] U.S. Cl. ...................... 364/468; 29/740; 29/743; 364/491
[58] Field of Search .......... 364/468, 474.2, 488–491; 29/739–743, 701–703, 706–708, 759; 361/400

[56] References Cited

U.S. PATENT DOCUMENTS

| | | | |
|---|---|---|---|
| 4,706,187 | 11/1987 | Arai et al. | 29/741 X |
| 4,763,405 | 8/1988 | Murita et al. | 29/740 |
| 4,805,110 | 2/1989 | Takahashi et al. | 364/491 X |

*Primary Examiner*—Joseph Ruggiero
*Attorney, Agent, or Firm*—Wenderoth, Lind & Ponack

[57] ABSTRACT

A component placement machine for mounting, on a substrate placed in position by an XY-table, a first electronic component supplied from an electronic component-supply section, includes an electronic component-holding portion for holding the first electronic component and being vertically movable; and a device for setting a movement-prohibiting time period of the XY-table by calculating a period of time in which there is a possibility that the first electronic component and a second electronic component mounted on the substrate may interfere with each other, based on a height of the first electronic component and a maximum height of the second electronic component.

4 Claims, 9 Drawing Sheets

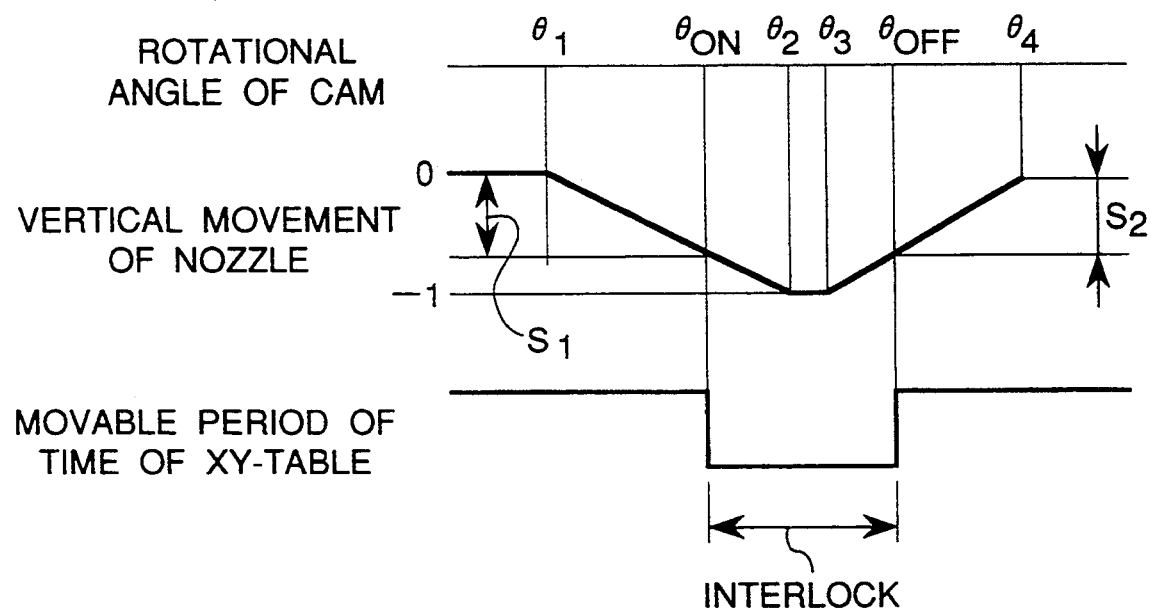

APPARATUS FOR MOUNTING ELECTRONIC COMPONENT ON SUBSTRATE

BACKGROUND OF THE INVENTION

The present invention relates to an apparatus for mounting an electronic component held by a component-holding portion thereof on a circuit substrate at a predetermined position thereof. More specifically, the present invention relates to an apparatus for attaching an electronic component held by a component-holding portion thereof onto a circuit substrate at a predetermined position thereof or an apparatus for inserting the component in a hole of the substrate.

Referring to FIGS. 6–10, an example of a conventional apparatus for mounting an electronic component on a circuit substrate is described below.

Referring to FIG. 6, the apparatus comprises a rotary table 31 which rotates at a predetermined angle intermittently; a plurality of rods 32, vertically movable, disposed around the periphery of the rotary table 31 at regular intervals each corresponding to the predetermined rotational angle of the rotary table 31; and a plurality of nozzles 33, for sucking the electronic component thereto, installed on the lower end of each rod 32. The apparatus further comprises a plurality of mechanical valves 34, provided on the rotary table 31, which turn a vacuum circuit on and off for operating each nozzle 33; a component supply section 35 for supplying the electronic component to an electronic component-sucking position at which it is sucked by the nozzle 33; and an XY-table 36 which secures a circuit substrate 37 thereto on which the electronic component is mounted. The XY-table 36 is moved so that a predetermined electronic component-mounting position of the substrate 37 coincides with the nozzle 33 holding the electronic component. As shown in FIG. 7, the rod 32 is supported to be rotatable and vertically movable by a nozzle unit 38 installed on the rotary table 31. A lever 43 of a cam/lever mechanism 42 is arranged to pivotally move around a shaft 43a. One end of the lever 43 engages a block 41 disposed at the upper end of the rod 32 and the other end of the lever 43 engages a cam 52. Then, the lever 43 pivots in response to the rotation of the cam 52 to move the rod 32 upward and downward through the block 41.

As shown in FIG. 8, as a result of the rotation of the cam 52 of the cam/lever mechanism 42 for moving the nozzle 33 vertically at an angle of 360°, during the first half of a predetermined time period in which one electronic component is mounted on the substrate 37, the rotary table 31 rotates a predetermined angle (index period of time) and the XY-table 36 moves so that the predetermined electronic component-mounting position coincides with the position of the nozzle 33 holding the electronic component. During the second half of the predetermined period of time, the nozzle 33 moves downward to mount the electronic component on the substrate 37 and then moves upward.

The above-described index period of time means the .period of time in which the nozzle 33 is at its uppermost position or the period of time obtained by the sum of an appropriate allowable period of time before and after the period of time in which the nozzle 33 is at the uppermost position and the period of time in which the nozzle 33 is at the uppermost position. The movable period of time of the XY-table 36 is set based on the vertical movement of the nozzle 33. That is, as shown in FIG. 9, the movable period of time of the XY-table 36 terminates when the distance $H_3$ between the lower end of the nozzle 33 and the upper surface of the substrate 37 becomes equal to the sum of the maximum warpage of the substrate 37 and a height which is twice as large as the height of the electronic component 39 of the maximum height, as a result of the downward movement of the nozzle 33 in the distance of h from its uppermost position. As shown in FIG. 10, the movable period of time of the XY-table 36 starts when the distance $H_4$ between the lower end of the nozzle 33 and the upper surface of the substrate 37 becomes equal to the sum of the height of the electronic component 39 of the maximum height and the maximum warpage of the substrate 37, as a result of the upward movement of the nozzle 33 in a predetermined distance from its lowermost position.

During the movable period of time of the XY-table 36 set as described above, there is no possibility that the nozzle 33 or the very high electronic component 39 held by the nozzle 33 interferes with a very high electronic component which has been mounted on the substrate 37 even though the electronic component 39 is mounted in the vicinity of the electronic component which has been mounted on the substrate 37. However, the movable period of time of the XY-table 36 is short. As a result, the XY-table 36 is required to move a long distance so that the predetermined electronic component-mounting position of the substrate 37 coincides with the position of the nozzle 33 holding the electronic component 39. Then, if those positions do not coincide with each other within the movable period of time of the table 36, the entire period of time for mounting one electronic component on the substrate 37 must be longer. Thus, the apparatus is not efficient.

On the other hand, referring to FIG. 7, a gear 39 for transmitting a rotary force to the rod 32 is installed on an upper portion of the rod 32. A vacuum tube 40 extending from the mechanical valve 34 is connected to the upper end of the rod 32 to operate the nozzle 33. A cylinder 45 for moving a stopper 44 vertically between an upper position and a lower position is provided below the lever 43. The stopper 44 engages the lever 43 of the cam/lever mechanism 42 at the upper position when the electronic component is held in an inappropriate posture by the nozzle 33. In this manner, the downward movement of the block 41 is prevented, i.e., the operation for mounting the electronic component on the substrate 37 is stopped.

The apparatus further comprises a pusher 46 for performing the change-over of the mechanical valve 34 which turns the vacuum circuit on and off for operating the nozzle 33 and a change-over cam/lever mechanism 47 for driving the pusher 46. A cylinder 50 for moving a stopper 49 vertically between an upper position and a lower position is provided below the change-over cam/lever mechanism 47. At the upper position, the stopper 49 engages the lever 48 of the change-over cam/lever mechanism 47, thereby preventing the vacuum circuit from being turned off by the pusher 46. That is, when the electronic component is held in an inappropriate posture by the nozzle 33, the nozzle 33 keeps holding the electronic component.

The above-described conventional apparatus has a complicated construction and is expensive. As a means for preventing the electronic component from being mounted on the substrate 37 when the electronic component is held in an inappropriate posture by the nozzle 33, the apparatus is provided with the stopper 44 which engages the cam/lever mechanism 42 for vertically moving the nozzle 33, the stopper 49 which engages the change-over cam/lever mechanism 47 for performing the change-over of the mechanical valve 34, and the cylinders 45 and 50 for driving the stoppers 44 and 49, respectively.

In addition, the apparatus has a slow response because of the use of the long vacuum tube 40 connecting the mechanical valve 34 and the nozzle 33 to each other.

SUMMARY OF THE INVENTION

It is an object of the present invention to provide an apparatus for mounting an electronic component on a circuit substrate, which allows an XY-table to move for a long time within a predetermined electronic component-mounting period of time so that the XY-table is capable of moving a long distance.

It is another object of the present invention to provide an apparatus for mounting an electronic component on a circuit substrate, which has simple and inexpensive construction to prevent the electronic component from being mounted on the substrate when it is held by a nozzle in an inappropriate posture.

It is a further object of the present invention to provide an apparatus for mounting an electronic component on a circuit substrate, in which a vacuum circuit for operating a nozzle has a high-speed response.

In accomplishing these and other objects, according to one aspect of the present invention, there is provided an apparatus for mounting, on a substrate placed in position by an XY-table, a first electronic component supplied from an electronic component-supply section, comprising:

an electronic component-holding portion for holding the first electronic component and being vertically movable; and means for setting a movement-prohibiting time period of the XY-table by calculating a period of time in which there is a possibility that the first electronic component and a second electronic component mounted on the substrate may interfere with each other, based on the height t of the first electronic component and the maximum height $H_1$ of the second electronic component.

According to another aspect of the present invention, there is provided the apparatus in which the electronic component-holding portion is a nozzle, and which further comprises:

a vertically movable slide block;

a nozzle, which is mounted on the slide block, for sucking an electronic component;

a mechanical valve, which is mounted on the slide block, for turning a vacuum circuit on and off for operating the nozzle;

a first cam/lever mechanism, for vertically moving the slide block, disposed at an electronic component-mounting position;

a second cam/lever mechanism, for operating an OFF-control lever of the mechanical valve when the slide block moves downward, disposed at the electronic component-mounting position; and a stopper which engages a lever of the first cam/lever mechanism so as to stop the downward movement of the slide block.

BRIEF DESCRIPTION OF THE DRAWINGS

These and other objects and features of the present invention will become clear from the following description taken in conjunction with the preferred embodiments thereof with reference to the accompanying drawings, in which:

FIG. 2 is a timing chart showing the relationship among the rotational angle of a cam, a nozzle, and the interlock of the XY-table;

DETAILED DESCRIPTION OF THE INVENTION

Figure 1A:
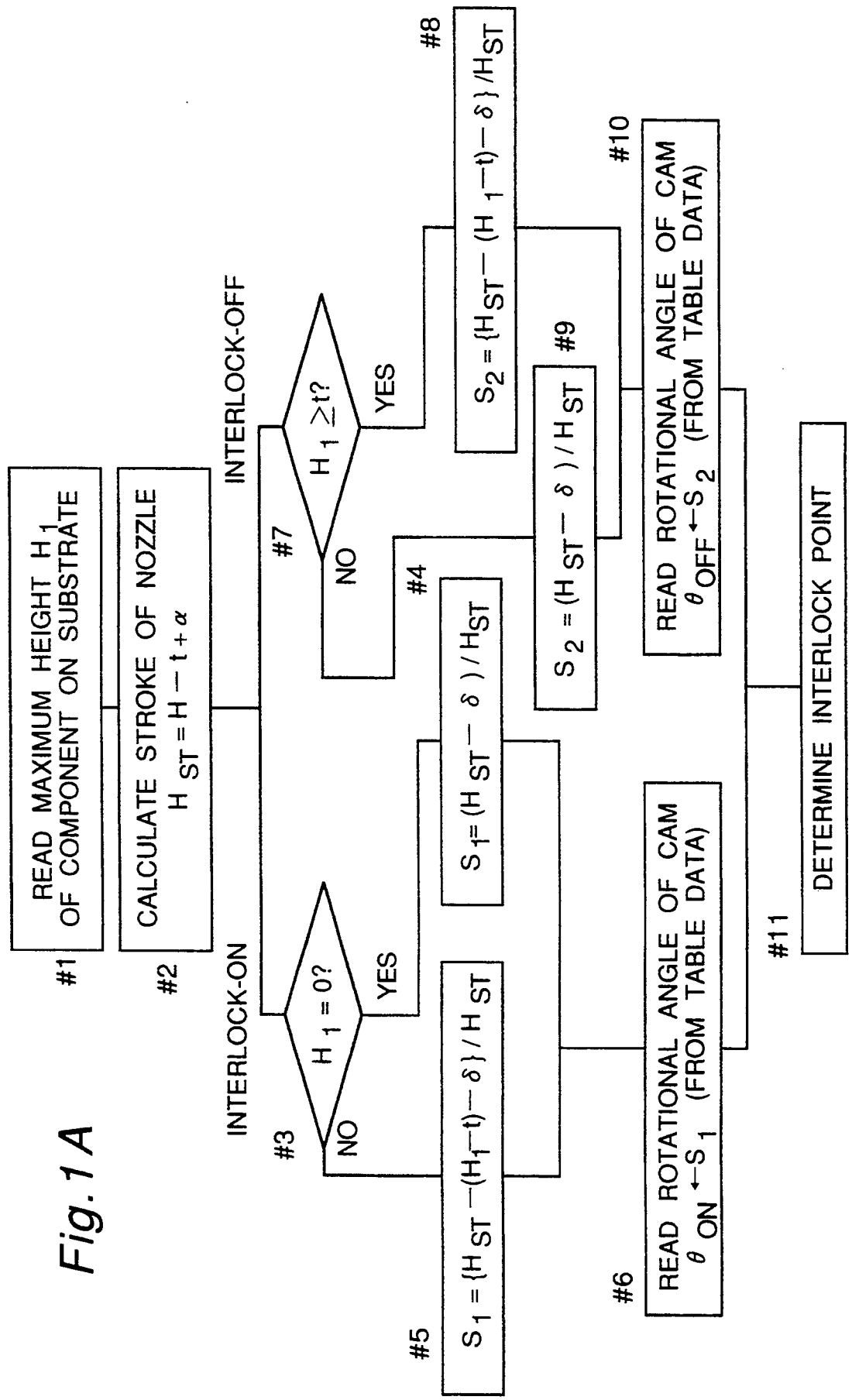
FIG. 1A is a flowchart of a calculation for setting an interlock timing of an XY-table of an apparatus for mounting an electronic component on a substrate according to a first embodiment of the present invention.

Before the description of the present invention proceeds, it is to be noted that like parts are designated by like reference numerals throughout the accompanying drawings.

Figure 6:
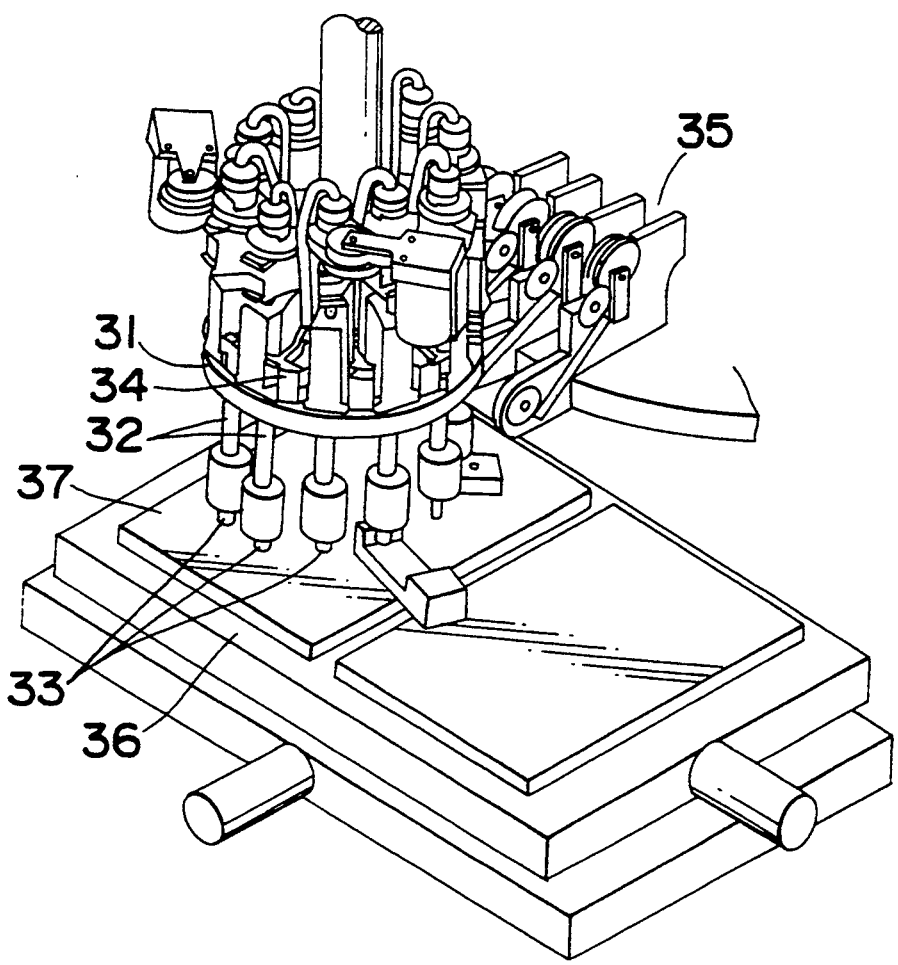
FIG. 6 is a perspective view showing a conventional apparatus for mounting an electronic component on a substrate.
Figure 7:
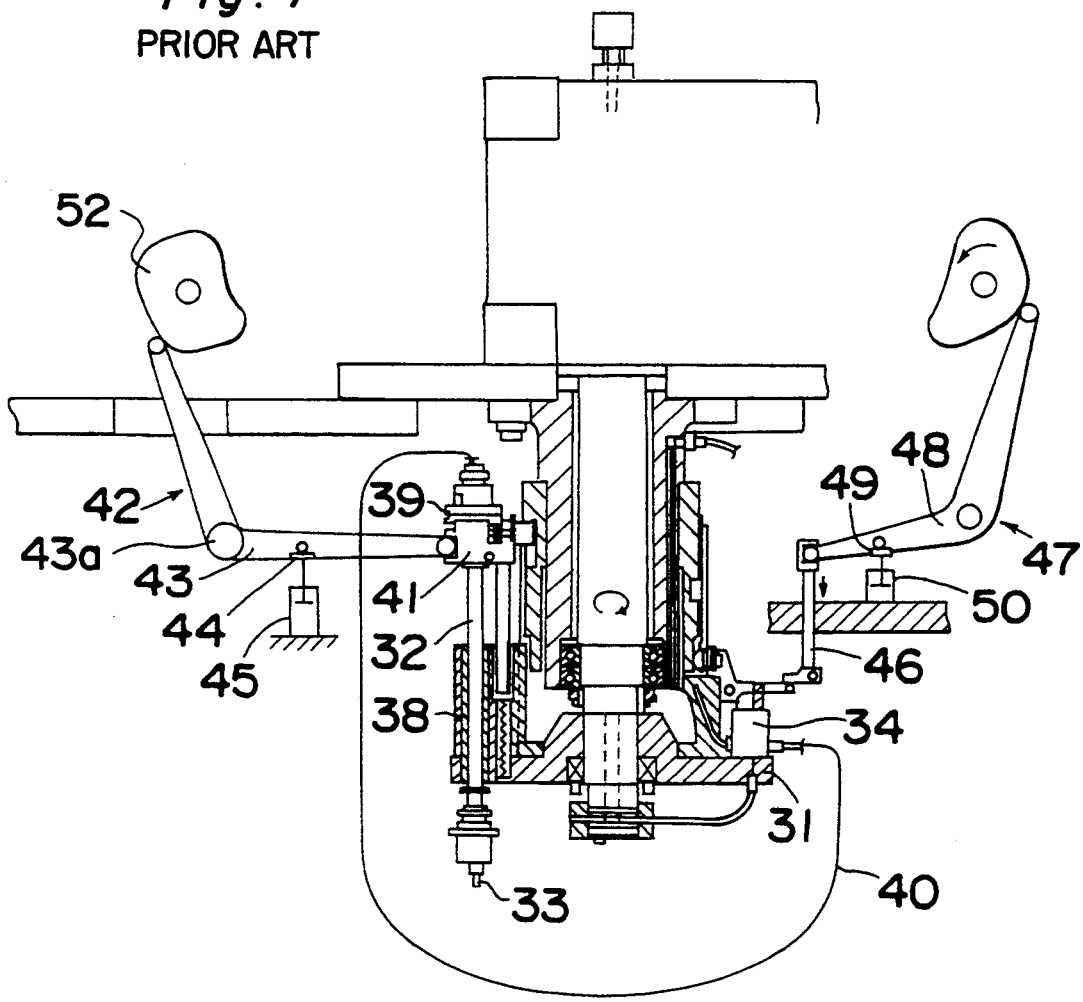
FIG. 7 is a vertical sectional view showing the apparatus of FIG. 6.
Figure 8:
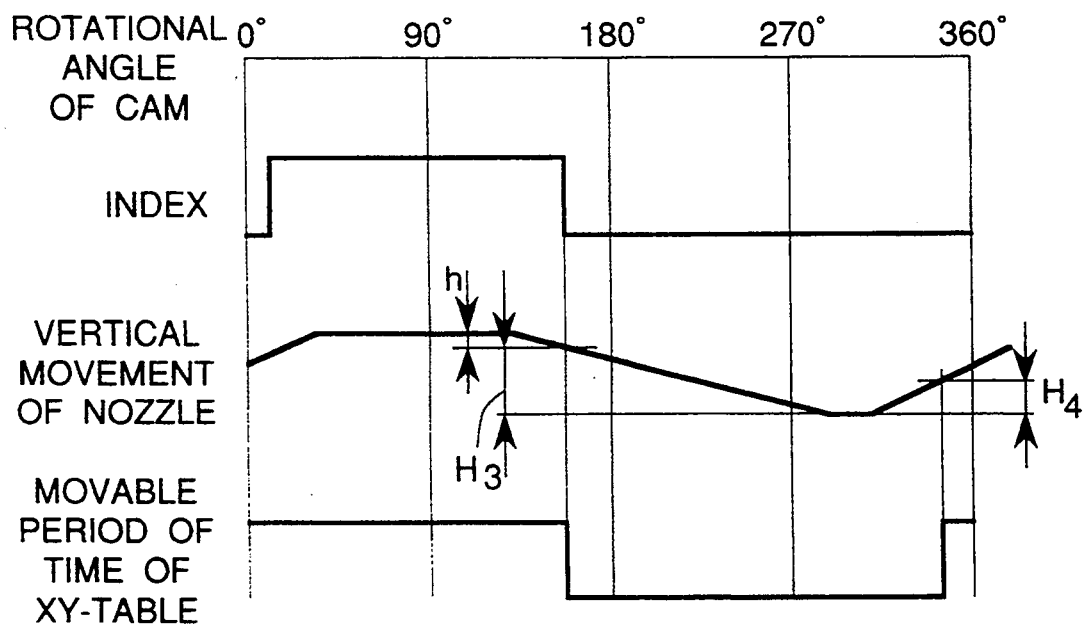
FIG. 8 is a timing chart showing the relationship among the rotational angle of a cam, an index, the vertical movement of a nozzle, and the interlock of an XY-table of a conventional apparatus for mounting an electronic component on a substrate.
Figure 9:
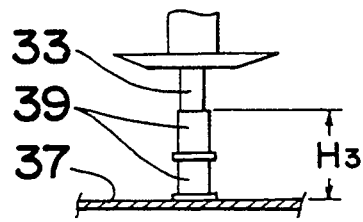
FIG. 9 is an explanatory view of the setting condition of an interlock-start timing.
Figure 10:
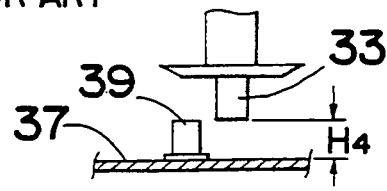
FIG. 10 is an explanatory view of the setting condition of an interlock-termination timing.

An apparatus according to a first embodiment of the present invention is described below with reference to FIGS. 1A through 3. The description of the mechanical construction of the apparatus of the first embodiment is omitted because it is similar to that of the conventional apparatus of FIGS. 6 and 7.

Figure 3:
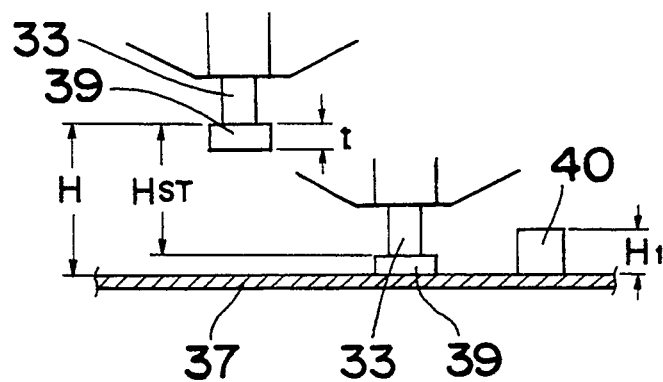
FIG. 3 is an explanatory view of an interference relationship between electronic components in mounting them on a substrate.

Referring to FIG. 3, the substrate 37 is secured to an XY-table 36 (FIG. 6) at a desired position thereof. An electronic component 39 is sucked by the nozzle 33 and mounted on the substrate 37 on which an electronic component 40 has been already mounted. Let it be assumed that the height of the electronic component 39 held by the nozzle 33 is t; the maximum height of the electronic component 40 mounted on the substrate 37 is $H_1$; the distance between the lower end of the nozzle 33 at its uppermost position and the upper surface of the substrate 37 is H; and the movable range, namely, the stroke of the nozzle 33 between the uppermost position and the lowermost position is $H_{ST}$.

Referring to FIG. 2, let it be also assumed that the nozzle 33 starts moving downward from the uppermost position of the stroke when the rotational angle of the cam 52 (FIG. 7) is $\theta_1$; reaches the lowermost position of the stroke when the rotational angle of the cam 52 is starts moving upward when the rotational angle of the cam 52 is $\theta_3$; and returns to the upper, host position when the rotational angle of the cam 52 is $\theta_4$. There is no possibility that until the nozzle 33 moves a predetermined distance downward from its uppermost position, that is, the rotational angle of the cam 52 is not greater than a predetermined rotational angle, the electronic component 39 held by the nozzle 33 interferes with the electronic component 40 mounted on the substrate 37 even though the XY-table 36 is moved. But it is necessary to prohibit the XY-table 36 from moving when the rotational angle of the cam 52 is greater than the predetermined rotational angle thereof. The rotational angle of the cam 52 corresponding to the start point of the movement-prohibiting time period (interlock time period) of the XY-table 36 is set as $\theta_{ON}$ (interlock-on point). It is also necessary to prohibit the XY-table 36 from moving while the nozzle 33 is moving upward from the lowermost position thereof until it reaches a predetermined position. There is no possibility that the nozzle 33 which has released the electronic component 39 interferes with the electronic component 40 mounted on the substrate 37 while the nozzle 33 is moving upward from the predetermined position to the uppermost position. The rotational angle of the cam 52 corresponding to the termination point of the interlock time period is set as $\theta_{OFF}$ (interlock-off point).

Figure 1B:
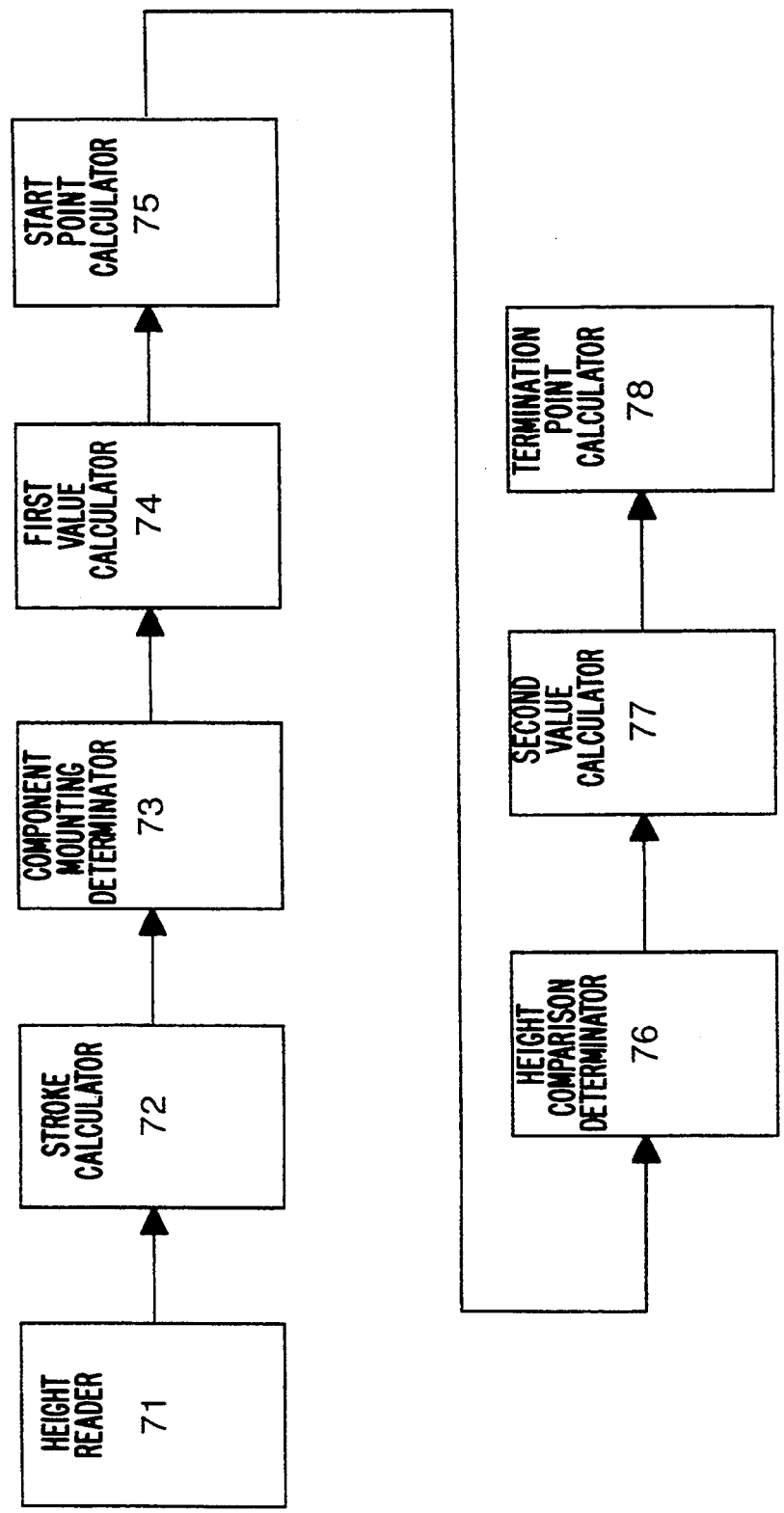
FIG. 1B is a block diagram showing the construction of the apparatus for performing the flowchart.

With reference to FIG. 1A, description is made below on the method for calculating the interlock-on (interlock start) point $\theta_{ON}$ and the interlock-off (interlock termination) point $\theta_{OFF}$. FIG. 1B shows a block diagram showing the construction of the apparatus for performing the flowchart in FIG. 1A. The apparatus includes a first through eighth means 71-78. The first means 71 reads the maximum height $H_1$ of the second electronic component 40. The second means 72 calculates the stroke $H_{ST}$ of the nozzle 7 in mounting the electronic component 39 on the substrate 37. The third means 73 decides whether or not the electronic component 40 has been mounted on the substrate 37. The fourth means 74 calculates a first value $S_1$ by an equation: $S_1 = [H_{ST} - (H_1 - t) - \delta]/H_{ST}$, where $\delta$ is a maximum warpage of the substrate, if the third means 73 has decided that the electronic component 40 has not been mounted on the substrate; and calculate a second value $S_1$ by an equation: $S_1 = (H_{ST} - \delta)/H_{ST}$, if the third means 73 has decided that the electronic component 40 has been mounted on the substrate 37. The fifth means 75 calculates the start point of a time period in which there is a possibility that the two electronic components 40 and 39 interfere with each other, based on the first value $S_1$ obtained by the fourth means 74. The sixth means 76 decides whether or not the maximum height $H_1$ of the electronic component 40 is greater than or equal to the height t of the electronic component 39. The seventh means 77 calculates a second value $S_2$ by an equation: $S_2 = (H_{ST} - \delta)/H_{ST}$, if the sixth means 76 has decided that the maximum height $H_1$ of the electronic component 40 is greater than or equal to the height t of the electronic component 39, and calculates a second value $S_2$ by an equation: $S_2 = \{H_{ST} - (H_1 - t) - \delta\}/H_{ST}$, if the sixth means 76 has decided that the maximum height $H_1$ of the electronic component 40 is smaller than the height t of the electronic component 39. The eighth means 78 calculates the termination point of the time period in which there is a possibility that the two electronic components 40 and 39 interfere with each other, based on the second value $S_2$ obtained by the seventh means 77. The above method for calculating the interlock-on (interlock start) point $\theta_{ON}$ and the interlock-off (interlock termination) point $\theta_{OFF}$ will be described below in detail referring to FIG. 1A.

First, at step #1, the maximum height $H_I$ of the electronic component 40 mounted on the substrate 37 is read. At step #2, the stroke $H_{ST}$ is calculated. As shown in FIG. 3, $H_{ST}$ is given as $(H - t + \alpha)$, where $\alpha$ is the distance required for the nozzle 33 to press the electronic component 39 against the substrate 37 in mounting the electronic component 39 on the substrate 37.

At step #3, in order to set the interlock start point $\theta_{ON}$, it is decided whether or not $H_1$ is zero, i.e., it is decided whether or not the electronic component 40 has been mounted on the substrate 37. If no, the program goes to step #4 at which $S_1 = (H_{ST} - \delta)/H_{ST}$ is calculated. If yes, the program goes to step #5 at which $S_1 = \{H_{ST} - (H_1 - t) - \delta\}/H_{ST}$ is calculated. In this equation, $\delta$ is the maximum warpage amount of the substrate 37.

The above calculated result $S_1$ is the ratio (dimensionless number) between the stroke $H_{ST}$ which is set as one and the distance of the nozzle 33 between its uppermost position and a certain position downward from the uppermost position in which there is no possibility that the electronic component 39 held by the nozzle 33 interferes with the electronic component 40 mounted on the substrate 37. Then, at step #6, based on the calculated result $S_1$, the rotational angle $\theta_{ON}$ of the cam 52 corresponding to the interlock start point is read by using table data.

In order to set the interlock termination point, it is decided at step #7 whether or not $H_1 \geq t$, namely, whether or not the maximum height $H_1$ of the electronic component 40 mounted on the substrate 37 is greater than or equal to the height t of the electronic component 39 which is to be mounted on the substrate 37. If yes, the program goes to step #8 at which $S_2 = \{H_{ST} - (H_1 - t) - \delta\}/H_{ST}$ is calculated. If no, the program goes to step #9 at which $S_2 = (H_{ST} - \delta)/H_{ST}$ is calculated. The above calculated result $S_2$ is the ratio (dimensionless number) between the stroke $H_{ST}$ which is set as one and the distance of the nozzle 33 between the uppermost position and a certain position downward from the upper, host position in which there is no possibility that the nozzle 33 which has released the electronic component 39 interferes with the electronic component 40 mounted on the substrate 37. Then, at step #10, based on the calculated result $S_2$, the rotational angle $\theta_{OFF}$ of the cam 52 corresponding to the interlock termination point is read by using the table data.

Based on the rotational angles $\theta_{ON}$ and $\theta_{OFF}$ corresponding to the interlock start point and the interlock termination point, the interlock time period is calculated at step #11. The XY-table 36 is movable except the interlock time period. The above-described method can set the movable time period of the XY-table 36 longer than the conventional method of setting an interlock time period so that the electronic component 39 of the maximum height held by the nozzle 33 and the electronic component 40 of the maximum height mounted on the substrate 37 do not interfere with each other. Consequently, the XY-table 36 can be moved a longer distance within a predetermined period of time, which contributes to an efficient mounting of the electronic component 39 on the substrate 37.

The rotational angles $\theta_{ON}$ and $\theta_{OFF}$ of the cam 52 corresponding to the interlock start point and the interlock termination point are set as desired according to the table data in the first embodiment, but they may be set stepwise.

In the first embodiment, the present invention is applied to the apparatus for mounting an electronic component on a substrate, but may be applied to other electronic component-mounting apparatus such as an apparatus for inserting a lead wire into a hole of a substrate.

In the apparatus according to the first embodiment of the present invention, based on the maximum height of the electronic component mounted on the substrate and the height of the electronic component held by the electronic component-holding portion, calculations are performed in order to calculate the period of time in which there is a possibility that the XY-table is moved after the electronic component-holding portion starts mounting the electronic component on the substrate and thus the electronic component held by the electronic component-holding portion and the electronic component mounted on the substrate interferes with each other. The period of time thus calculated is set as the movement-prohibiting time period of the XY-table. The movable time period of the XY-table thus set is longer than that set by the conventional method. Consequently, as compared with the conventional art, the XY-table is capable of moving a longer distance within a predetermined period of time, which contributes to an efficient mounting of the electronic component 37 on the substrate 39.

Figure 4:
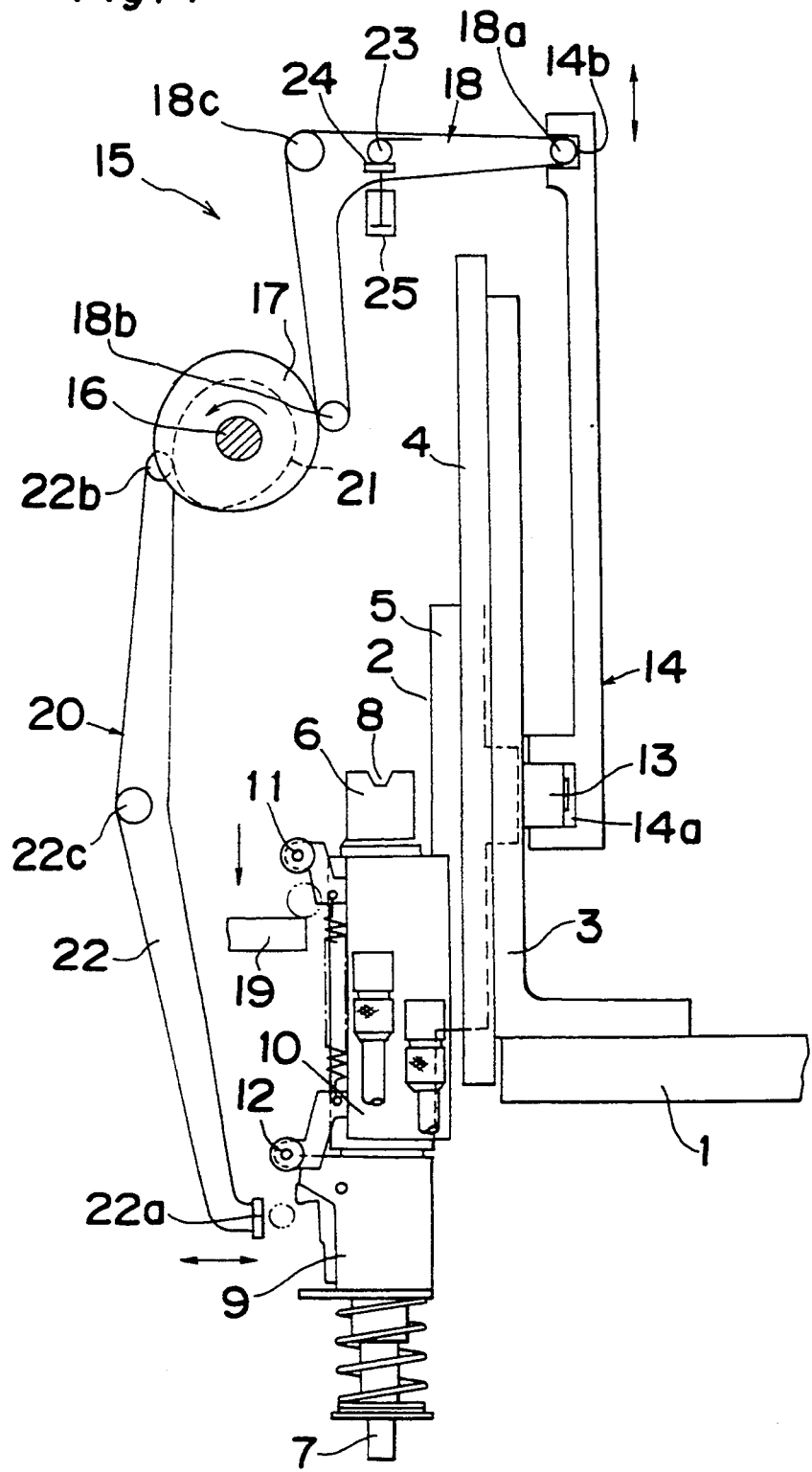
FIG. 4 is a partially enlarged side elevation of an apparatus for mounting an electronic component on a substrate according to a second embodiment of the present invention.
Figure 5:
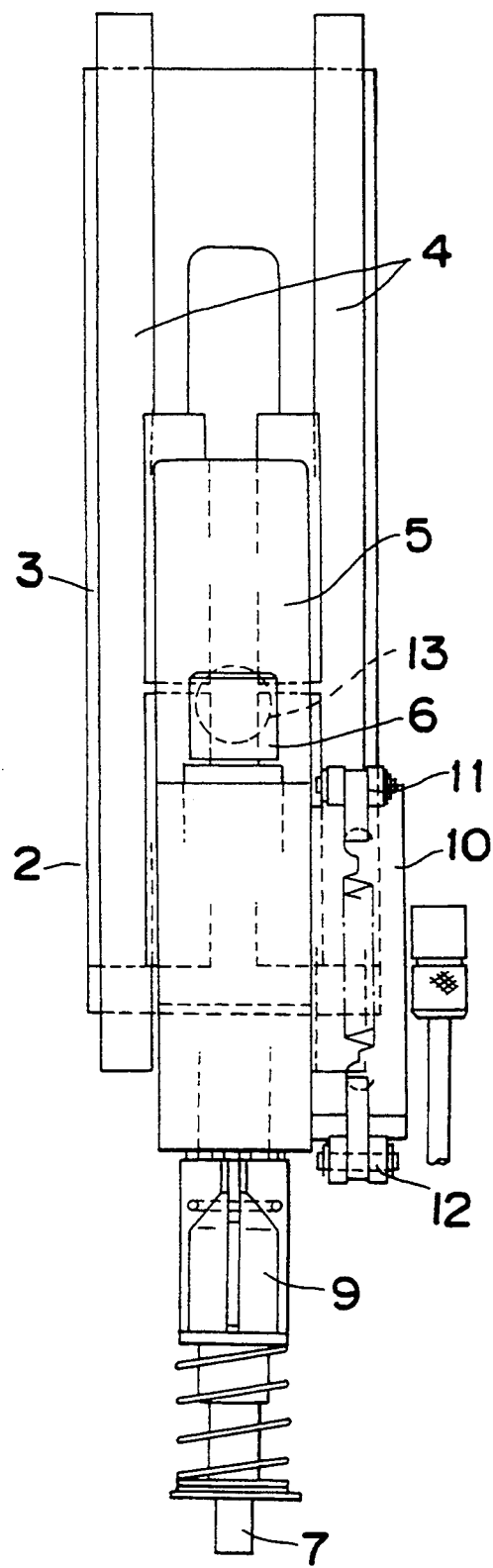
FIG. 5 is a front view of the apparatus shown in FIG. 4.

An apparatus according to a second embodiment of the present invention is described below with reference to FIGS. 4 and 5.

The apparatus comprises a rotary table 1 which is intermittently rotated a predetermined angle and in which a plurality of mounting units 2 are disposed around the periphery of the rotary table 1 at regular intervals each corresponding to the predetermined rotational angle of the rotary table 1. Each mounting unit 2 is installed on the upper surface of the rotary table 1 by means of a bracket 3. A guide 4 is installed on the front surface of the bracket 3, and a slide block 5 is vertically movably supported by the guide 4. A rod 6 is rotatably mounted on the slide block 5. A nozzle 7 for sucking an electronic component thereto is mounted on the lower end of the rod 6. A V-shaped groove 8 for transmitting a rotational force to the electronic component is formed on the upper end of the rod 6 so that the electronic component held by the nozzle 7 can be rotated to a desired angle. Although not shown in FIGS. 4 and 5, the nozzle 7 comprises large, medium, and small nozzles to superimpose onto each other so that any one of the three nozzles is selectively used depending on the size of the electronic component. A mechanism for locking the selected nozzle is incorporated in a block 9 located above the nozzle 7.

A mechanical valve 10 for turning a vacuum circuit on and off for operating the nozzle 7 which includes a vacuum pump is installed on a side surface of the slide block 5. An ON-control lever 11 for switching the vacuum circuit from OFF to ON projects from an upper front portion of the mechanical valve 10. An OFF-control lever 12 for switching the vacuum circuit from ON to OFF projects from a lower front portion of the mechanical valve 10. As described later, the ON-control lever 11 and the OFF-control lever 12 take an upper position and a lower position, respectively depending on the position of the slide block 5.

A cam follower 13 is installed on a rear surface of the slide block 5. A recess portion 14a disposed at the lower end of a slider 14 vertically movable engages removably the cam follower 13 of the rear portion of the bracket 3 when the nozzle 7 is located at the electronic component-sucking position or the electronic component-mounting position around the rotary table 1. A recess portion 14b disposed at the upper end of the slider 14 engages a cam/lever mechanism 15 for vertically moving the slider 14. The cam/lever mechanism 15 comprises a cam 17 fixed to a cam shaft 16 and a lever 18 which is pivotal. The intermediate portion of the lever 18 is pivotably fixed to a shaft 18c, one end 18b thereof engages the cam 17, and the other end 18a thereof engages the recess portion 14b of the slider 14. With the rotation of the cam shaft 16, the cam 17 pivots the lever 18 on the shaft 18c. As a result, the slider 14 moves vertically. The cam/lever mechanism 15 is respectively disposed at the electronic component-sucking position and the electronic component-mounting position around the rotary table 1.

A fixed member 19 is disposed below the ON-control lever 11 of the mechanical valve 10 at the electronic component-sucking position around the rotary table 1. When the slide block 5 moves downward and the nozzle 7 sucks the electronic component at the electronic component-sucking position, the fixed member 19 acts on the ON-control lever 11, thus turning on the vacuum circuit.

A change-over cam/lever mechanism 20 is provided at the electronic component-mounting position around the rotary table 1 and its lower end 22a acts on the OFF-control lever 12 of the mechanical valve 10, thus switching the vacuum circuit from ON to OFF when the slide block 5 moves downward in mounting the electronic component held by the nozzle 7 on the substrate. As a result, the electronic component is released from the nozzle 7. The change-over cam/lever mechanism 20 comprises a switching cam 21 fixed to the cam shaft 16 and a lever 22 which pivots on a shaft 22c. The upper end 22b of the lever 22 engages the cam 21 and the lower end 22a thereof becomes opposed to the OFF-control lever 12 when the slide block 5 has moved to its lower position and as such the OFF-control lever 12 is at its lower position.

An engaging roller 23 is installed at an approximately intermediate portion between the other end 18a and the shaft 18c of the lever 18 of the cam/lever mechanism 15 disposed at the electronic component-mounting position thereof. A stopper 24 which takes an upper position and a lower position is provided below the roller 23. At the upper position, the stopper 24 moved to the upper position by a cylinder 25 engages the roller 23, thus preventing the slider 14 from moving downward. The stopper 24 normally takes the lower position so as not to prevent the movement of the slider 14.

The operation of the apparatus of the above construction is as follows: When the rotary table 1 rotates a predetermined angle and the mounting unit 2 stops at the electronic component-sucking position, the cam/lever mechanism 15 disposed at the electronic component-sucking position moves the slide block 5 downward via the slider 14 in accordance with the rotation of the cam 17 and the pivotal movement of the lever 18. As a result, the nozzle contacts the upper surface of the electronic component and simultaneously, the fixed member 19 acts on the ON-control lever 11 of the mechanical valve 10, and the nozzle 7 is connected with the vacuum circuit. In this manner, the nozzle 7 sucks the electronic component thereto.

Then, the slide block 5 moves upward and the rotary table 1 rotates a predetermined angle and as a result, the mounting unit 2 stops at a position corresponding to the electronic component-mounting position of the substrate. While the mounting unit 2 is moving from the electronic component-sucking position to the electronic component-mounting position, it is decided whether or not the electronic component is held by the nozzle 7 in an appropriate state by examining the pressure of the vacuum circuit and the image of the electronic component held by the nozzle 7.

If it is decided that the electronic component has been appropriately held by the nozzle 7, the cam/lever mechanism 15 moves the slide block 5 downward via the slider 14 so that the electronic component held by the nozzle 7 is mounted on the substrate at a predetermined position thereof. Simultaneously, according to the rotation of the cam 21 and the pivotal movement of the lever 22, the lower end 22a of the lever 22 acts on the OFF-control lever 12 which is at its lower position. As a result of OFF of the vacuum circuit, the electronic component is released from the nozzle 7 and then mounted on the substrate. Then, the slide block 5 moves upward and the rotary table 1 rotates the predetermined angle.

If it is decided that the electronic component has not been appropriately held by the nozzle 7, the stopper 24 which has been at the lower position is moved upward by the cylinder 25, thereby engaging the roller 23. Therefore, the lever 18 does not pivot although the cam 17 rotates, thus preventing the slider 14 and the slide block 5 from moving downward and consequently, the nozzle 7 remains stopped at the upper position. Since the lever OFF-control lever 12 is not at its lower position, i.e., the lever 22 is not opposed to the lower end 22a of the lever 22, the lever 22 pivots without contacting the OFF-control lever 12 although the change-over cam/lever mechanism 20 is operated by the rotation of the cam shaft 16. Consequently, the mechanical valve 10 remains ON. As such, the electronic component held by the nozzle 7 does not drop to the substrate.

In the apparatus according to the second embodiment of the present invention, if the electronic component is not mounted on the substrate because it has not been appropriately held by the nozzle, the stopper engages the roller installed on the lever of the cam/lever mechanism so as to stop the downward movement of the slide block. Therefore, the nozzle is prevented from moving downward and the lever of the change-over cam/lever mechanism pivots without contacting the OFF-control lever of the mechanical valve. By providing the stopper which is simple in construction and inexpensive, it is capable of prohibiting the downward movement of the nozzle and the change-over operation of the mechanical valve. In addition, the mechanical valve and the nozzle are mounted on the slide block and thus the distance between them becomes short. Accordingly, the apparatus has a high-speed response and allows the electronic component to be mounted on the substrate at a high speed.

Although the present invention has been fully described in connection with the preferred embodiments thereof with reference to the accompanying drawings, it is to be noted that various changes and modifications are apparent to those skilled in the art. Such changes and modifications are to be understood as being included within the scope of the present invention as defined by the appended claims unless they depart therefrom.

What is claimed is:

1. An apparatus for mounting, on a substrate placed in position by an XY-table, a first electronic component supplied from an electronic component-supply section, comprising:

an electronic component-holding portion for holding the first electronic component and being vertically movable; and means for setting a movement-prohibiting time period of the XY-table by calculating a period of time in which there is a possibility that the first electronic component and a second electronic component mounted on the substrate may interfere with each other, based on the height t of the first electronic component and the maximum height $H_1$ of the second electronic component.

2. The apparatus for mounting an electronic component on a substrate as claimed in claim 1, comprising:

first means for reading the maximum height $H_1$ of the second electronic component;

second means for calculating a stroke $H_{ST}$ of the component-holding portion in mounting the first electronic component on the substrate;

third means for deciding whether or not the second electronic component has been mounted on the substrate;

fourth means for calculating a first value $S_1$ by an equation:

$$S_1 = [H_{ST} - (H_1 - t) - \delta]/H_{ST},$$

where $\delta$ is a maximum warpage of the substrate, if the third means has decided that the second electronic component has not been mounted on the substrate; and for calculating said first value $S_1$ by an equation:

$$S_1 = (H_{ST} - \delta)/H_{ST},$$

if the third means has decided that the second electronic component has been mounted on the substrate;

fifth means for calculating a start point of a time period in which there is a possibility that the two electronic components may interfere with each other, based on the first value $S_1$ obtained by the fourth means;

sixth means for deciding whether or not the maximum height $H_1$ of the second electronic component is greater than or equal to the height t of the first electronic component;

seventh means for calculating a second value $S_2$ by an equation:

$$S_2 = (H_{ST} - \delta)/H_{ST},$$

if the sixth means has decided that the maximum height $H_1$ of the second electronic component is greater than or equal to the height t of the first electronic component; and for calculating said second value $S_2$ by an equation:

$$S_2 = \{H_{ST} - (H_1 - t) - \delta\}/H_{ST},$$

if the sixth means has decided that the maximum height $H_1$ of the second electronic component is smaller than the height t of the first electronic component; and eighth means for calculating a termination point of the time period in which there is a possibility that the two electronic components interfere with each other, based on the second value $S_2$ obtained by the seventh means.

3. The apparatus as claimed in claim 1, wherein the electronic component-holding portion is a nozzle, and further comprising:

a slide block vertically movable;

a nozzle, which is mounted on the slide block, for sucking an electronic component;

a mechanical valve, which is mounted on the slide block, for turning a vacuum circuit on and off for operating the nozzle;

a first cam/lever mechanism, for vertically moving the slide block, disposed at an electronic component-mounting position;

a second cam/lever mechanism, for operating an OFF-control lever of the mechanical valve when the slide block moves downward, disposed at the electronic component-mounting position; and a stopper which engages a lever of the first cam/lever mechanism so as to stop the downward movement of the slide block.

4. The apparatus as claimed in claim 2, wherein the electronic component-holding portion is a nozzle, and further comprising:

a slide block vertically movable;

a nozzle, which is mounted on the slide block, for sucking an electronic component;

a mechanical valve, which is mounted on the slide block, for turning a vacuum circuit on and off for operating the nozzle;

a first cam/lever mechanism, for vertically moving the slide block, disposed at an electronic component-mounting position;

a second cam/lever mechanism, for operating an OFF-control lever of the mechanical valve when the slide block moves downward, disposed at the electronic component-mounting position; and a stopper which engages a lever of the first cam/lever mechanism so as to stop the downward movement of the slide block.

* * * * *